United States Patent
Jensen et al.

(10) Patent No.: US 7,699,077 B2
(45) Date of Patent: Apr. 20, 2010

(54) TRANSPORT SYSTEM FOR NANOPARTICLES AND METHOD FOR THE OPERATION THEREOF

(75) Inventors: Jens Dahl Jensen, Berlin (DE); Ursus Kruger, Berlin (DE); Volkmar Luthen, Berlin (DE); Heike Schiewe, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 642 days.

(21) Appl. No.: 11/628,498

(22) PCT Filed: Jun. 8, 2005

(86) PCT No.: PCT/DE2005/001051

§ 371 (c)(1),
(2), (4) Date: Dec. 5, 2006

(87) PCT Pub. No.: WO2005/123978

PCT Pub. Date: Dec. 29, 2005

(65) Prior Publication Data

US 2008/0023087 A1    Jan. 31, 2008

(30) Foreign Application Priority Data

Jun. 18, 2004    (DE) ................. 10 2004 030 523

(51) Int. Cl.
*F15C 1/04*    (2006.01)

(52) U.S. Cl. ............................. 137/827; 137/13; 251/7; 251/129.06

(58) Field of Classification Search ................. 137/827, 137/13; 251/4–10, 129.01, 129.06
See application file for complete search history.

(56) References Cited

U.S. PATENT DOCUMENTS

| | | | | |
|---|---|---|---|---|
| 2,763,125 A | * | 9/1956 | Kadosch et al. ............... | 60/230 |
| 3,071,154 A | * | 1/1963 | Cargill et al. ............... | 137/807 |
| 3,485,254 A | * | 12/1969 | Ernst ........................ | 137/807 |
| 3,496,955 A | * | 2/1970 | Ziemer et al. ............... | 137/13 |

(Continued)

FOREIGN PATENT DOCUMENTS

| | | |
|---|---|---|
| DE | 38 09 734 | 5/1989 |
| DE | 697 12 739 | 9/1997 |
| DE | 196 32 393 | 2/1998 |
| DE | 100 55 318 | 12/2001 |
| DE | 101 35 434 | 2/2003 |
| EP | 0883893 | 5/2002 |
| GB | 2148152 | 5/1985 |

OTHER PUBLICATIONS

"Magnetism of Fe, Co and Ni Clusters in Molecular Beams," Billas et al., Journal of Magnetism and Magnetic Materials, vol. 168 (1997), pp. 64-84.
"XP-002343622," J. Chen et al., Jul. 24, 2002, Univ Beijing Chem.

*Primary Examiner*—John Rivell
*Assistant Examiner*—Craig M Schneider
(74) *Attorney, Agent, or Firm*—Young & Thompson

(57) ABSTRACT

A transport system for dry nanoparticles (18b). According to the invention, the nanoparticles (18b) are magnetized or electrically charged for transportation, a magnetic or electrical field is produced by a field generator (20a, 20) in the transport channel, and the nanoparticles (18b) migrate through the transport channel (12). The nanoparticles can be discharged through a discharge opening (13) which enables dosing to take place. In order to agglomerate the nanoparticles (18b) or to prevent attachment onto the inner wall (26), a coating (27) of the wall can be offset in oscillations by piezo electric actuators (28), the oscillations being transferred to the nanoparticles (18b). The dry nanoparticles can be handled in an advantageous manner due to the transport system, such that the dry nanoparticles need not be treated as a suspension.

9 Claims, 2 Drawing Sheets

U.S. PATENT DOCUMENTS

| | | | |
|---|---|---|---|
| 4,132,892 A | | 1/1979 | Wittmaack |
| 5,110,435 A | | 5/1992 | Haberland |
| 5,333,646 A | * | 8/1994 | Delot ......................... 137/827 |
| 6,482,306 B1 | * | 11/2002 | Yager et al. ................. 204/600 |
| 6,500,354 B1 | * | 12/2002 | Lee et al. ..................... 216/27 |
| 2001/0055529 A1 | | 12/2001 | Wixforth |
| 2003/0006140 A1 | * | 1/2003 | Vacca et al. ................. 204/547 |
| 2003/0077398 A1 | | 4/2003 | Strutt et al. |

* cited by examiner

TRANSPORT SYSTEM FOR NANOPARTICLES AND METHOD FOR THE OPERATION THEREOF

FIELD OF THE INVENTION

The invention relates to a transport system for nanoparticles.

The expression dried nanoparticles is understood to mean very small particles with dimensions in the nanometer range, which are each composed of a large number of atoms or molecules. When these are dry, they form a nanodisperse powder, that is to say no liquid carrier medium is provided for transportation of the nanoparticles.

BACKGROUND OF THE INVENTION

DE 196 32 393 A1 discloses that these so-called nanopowders cannot be poured without problems, so that, for example, external feeding into a PVD process is problematic. Provision is therefore made for the powders not to be used as the source material for feeding into PVD processes but, in fact, for the nanoparticles to be produced in situ within the PVD process. For this purpose, suitable source substances must be fed into the PVD process (physical vapor deposition) for the nanoparticles to be produced.

SUMMARY OF THE INVENTION

The object of the invention is to specify a transport system for nanoparticles, by means of which it is possible to transport nanopowders.

According to the invention, this object is achieved by a transport system for dry, magnetized nanoparticles, having a transport channel for the nanoparticles and having a field generator for a magnetic field, which is arranged with respect to the transport channel in such a manner that the magnetic field in the transport channel can be produced inhomogeneously with lines of force which are directed essentially along the profile of the transport channel. In this case, use is advantageously made of the effect that a force which is directed along the lines of force of the magnetic field is exerted in the direction of increasing magnetic induction on the magnetized nanoparticles by means of the inhomogeneous magnetic field in the interior of the transport channel.

An alternative solution to the stated problem is achieved by a transport system for dry, electrically charged nanoparticles, having a transport channel for the nanoparticles and a field generator for an electrical field, which is arranged with respect to the transport channel in such a manner that the electrical field can be produced with field lines which are directed at least essentially along the profile of the transport channel. This alternative advantageously makes use of the effect with electrically charged nanoparticles that a force acts on them along the field lines in the electrical field.

The transport system according to the invention for nanoparticles makes use of the effect that the nanoparticles can be moved even by small forces because their mass is very small, so that even a low level of magnetization or charge on the nanoparticles is sufficient for transportation in the transport system. This is because it has been found that nanoparticles exhibit a behavior when being transported which differs greatly from the behavior of conventional powder particles with particles sizes in the micrometer range. Because of their small particle size, nanoparticles in fact exhibit a behavior which is related to that of the individual charge carriers such as ions, when being transported.

Refinements of the transport system according to the invention envisage that the field generator for a magnetic field may be formed by an electrical coil which is in the form of a winding around the transport channel. A homogenous magnetic field is produced in the area of the coil in the transport channel, and decreases with increasing distance from the coil in the transport channel. Magnetized nanoparticles are thus accelerated towards the coil. A field generator for an electrical field may, for example, have a capacitor.

One particular refinement of the invention envisages that the transport channel opens into an ejection opening for the nanoparticles. The transport system can thus advantageously also be used as a nozzle, in which case the nanoparticles can be distributed uniformly by means of the nozzle, for example on a surface or in a volume. By way of example, a transport system with an ejection opening can also be used for PVD processes, for example for arc vaporization, in order to allow the nanoparticles to be introduced uniformly into a PVD layer.

According to one particular refinement, the transport system is characterized in that the inner wall of the transport channel can move radially with respect to its profile and is equipped with an actuator, in such a manner that the actuator can produce movements of the inner wall at right angles to the wall surface. This advantageously makes it possible to reduce or even suppress adhesion of nanoparticles to the inner wall of the transport channel. This simplifies the transport of the nanoparticles through the field generator, and, in particular, it is possible to prevent the transport channel from becoming blocked. In consequence, it is possible to also ensure transportation of nanoparticles in channels with very small diameters which are in the order of magnitude of three to five times the particle diameter of the nanoparticles. The actuator is particularly advantageously formed by a piezo-actuator which, for example, can cause the inner wall to oscillate in the ultrasound range.

The invention also relates to a method for operation of a transport system for nanoparticles. In this context, the object of the invention is to specify methods for operation of transport systems for nanoparticles, by means of which the transportation of the nanoparticles can be optimally matched to the respective application.

According to the invention, this object is achieved by a method in which a static field is produced in the transport channel of the transport system and is maintained as long as the nanoparticles are intended to be continuously conveyed. This is possible not only for magnetized nanoparticles by means of a suitable magnetic field but also for electrically charged nanoparticles by means of an electrical field, or else by means of a superimposition of an electrical and magnetic field, if the nanoparticles have suitable characteristics. The field generator thus provides the transport mechanism for transportation of the nanoparticles, as long as it is producing a field.

An alternative solution to the problem is a method in which a pulsating field is produced in the transport channel, with the nanoparticles being metered by adjustment of the pulses. The rate of change of the field strength of the pulsed field can be adjusted in accordance with the metering requirements. The rate of change can be influenced by variation of the pulse length, of the pulse magnitude, of the pulse interval and of the pulse shape. The nanoparticles are metered as a function of this by in each case restricting the time of the ejection or transportation of the nanoparticles in the transport channel.

BRIEF DESCRIPTION OF THE DRAWINGS

Further details of the invention will be described in the following text with reference to the drawing. In the drawing, identical or corresponding drawing elements are in each case provided with the same reference symbols, and will be explained only once, to the extent that they match between the individual figures. In the figures.

DETAILED DESCRIPTION OF EMBODIMENTS

Figure 1:
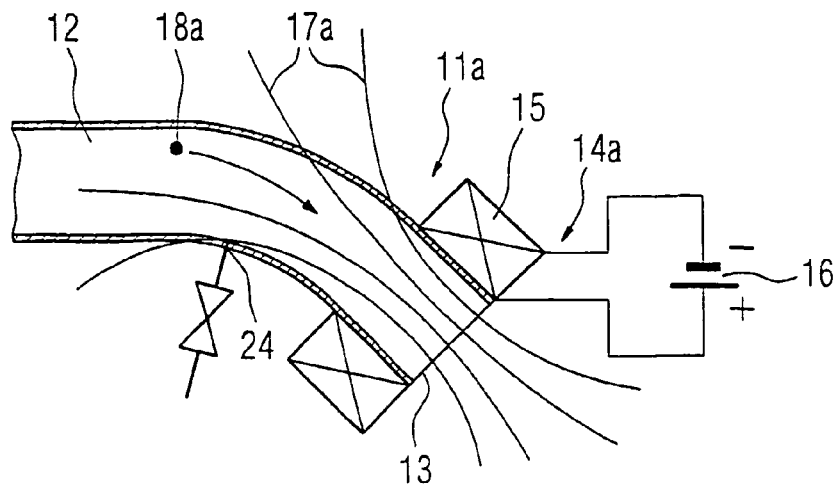
FIG. 1 schematically illustrates one exemplary embodiment of the transport system according to the invention, with a magnetic field generator, FIG. 2 schematically illustrates one exemplary embodiment of the transport system according to the invention, with a field generator for an electrical field.

FIG. 1 illustrates a transport system 11a which has a transport channel 12 which ends in an ejection opening 13. A field generator 14a is also provided in the area of the ejection opening and comprises an electrical coil 15 and an electrical power supply 16. The coil 15 surrounds the transport channel 12 in an annular shape at the ejection opening 13, so that a homogenous magnetic field is created in the interior of the transport channel 12 in the area of the ejection opening 13 (indicated by magnetic lines of force 17a). The magnetic field which is formed in the rest of the illustrated profile of the transport channel 12 outside the coil 15 is in contrast inhomogeneous, with the magnetic induction decreasing as the distance from the coil increases.

The profile of the transport channel 12 essentially follows the profile of specific lines of force of the magnetic field which is produced, with the transport channel in this case being curved. Alternatively (not illustrated), the transport channel can also be designed to be straight, since the magnetic field also decreases as the distance from the coil increases, when seen on the axis of symmetry of the coil 15. A magnetized nanoparticle 18a (for example composed of a ferromagnetic material such as iron) is aligned in the inhomogeneous magnetic field that is formed by the coil 15, and is accelerated within the transport channel 12 in the direction of the areas of the magnetic field with increasing magnetic induction, that is to say towards the coil 15. A magnetic field in the interior of the coil 15 is homogeneous, so that the nanoparticle is not accelerated anymore as it passes through this area. It is then ejected from the ejection opening 13 and is decelerated again in free space, as the magnetic field now becomes weaker. However, it can be detected here, for example by a particle flow of a PVD process (see FIG. 4).

Finally, a compressed-air connection 24 is provided on the transport channel 12 and has a valve through which compressed-air pulses can be fed into the transport channel. The compressed-air connection may also have (in a manner which is not illustrated) a plurality of inlet openings into the transport channel 12, in order to distribute the compressed air uniformly over the walls of the transport channel. The compressed-air pulses can be used to prevent adhesion of the nanoparticles 18a on the walls of the transport channel 12.

Figure 2:
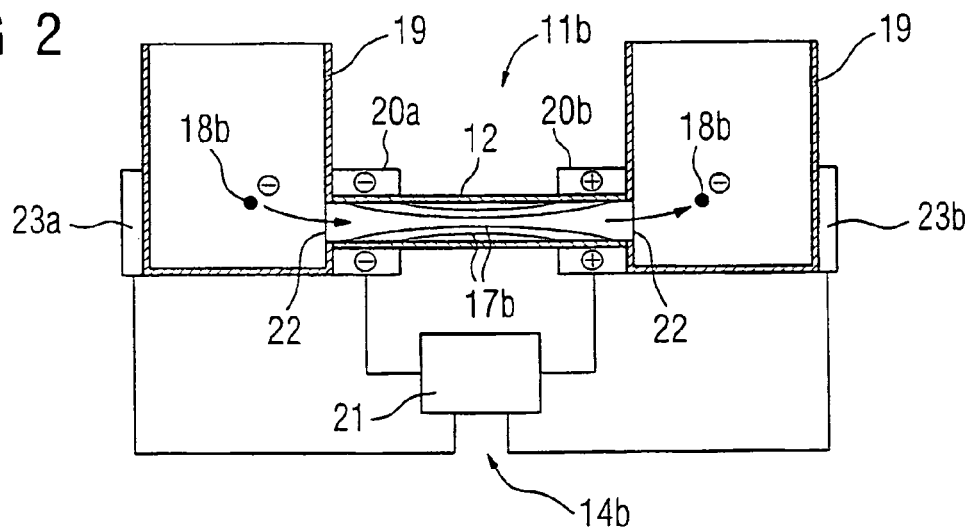

A transport system 11b as shown in FIG. 2 connects two containers 19 to one another, between which electrically charged nanoparticles 18b are intended to be exchanged. For this purpose, the transport channel 12 is equipped at its ends with annular electrodes 20a, 20b, which, together with an electrical control unit 21, form a field generator 14b, which is in the form of a capacitor, for an electrical field in the interior of the transport channel 12 (field lines 17b of the electrical field). The annular electrodes 20a, 20b can be driven by means of the control unit 21 in order to produce the electrical field. The electrical field in the interior of the transport channel 12 exerts a force on the electrically charged nanoparticles 18b which are located in the transport channel, such that they can be moved from one container 19 to the other. The direction of the transport through the transport channel 12 can be changed by reversing the polarity of the annular electrodes 20a, 20b by means of the control unit 21.

Furthermore, additional electrodes 23a, 23b are integrated in the walls of the containers 19 opposite the mouths 22 of the transport channel 12 into the containers 19, so that an electrical field can in fact also be built up in the containers, making it easier for the nanoparticles 18b to enter and leave the transport channel 12.

Figure 3:
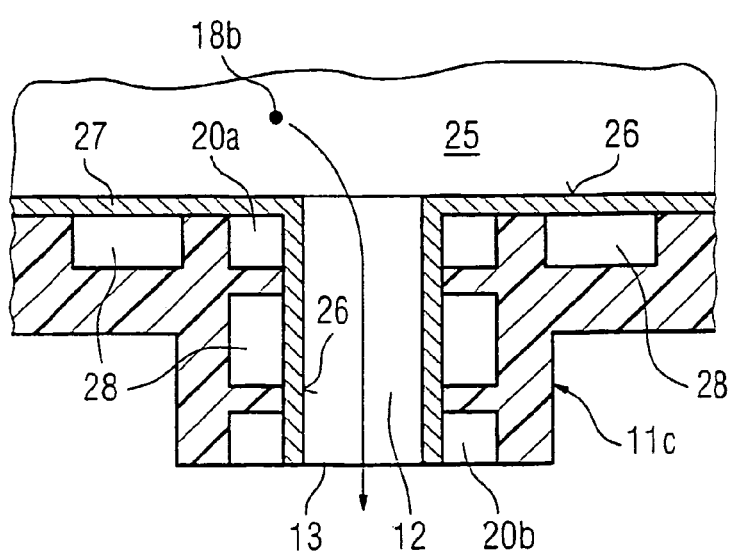
FIG. 3 illustrates a section through one exemplary embodiment of the transport system, as a nozzle, and FIG. 4 schematically illustrates a PVD coating installation with a nozzle as shown in FIG. 3.

FIG. 3 illustrates a transport system 11c which has a transport channel 12 in the form of a nozzle and with an ejection opening 13. At its end facing away from the ejection opening 13, the transport channel opens into a reservoir 25 for nanoparticles 18b. An inner wall 26 both of the reservoir 25 and of the transport channel 12 is formed by a coating 27, which can carry out various functions for the transport system 11c. Electrical isolation of the annular electrodes 20a, 20b is possible. Furthermore, the nanoparticles 18b can be statically charged on the coating 27, so that they are in an electrically charged form. Finally, the coating 27 is designed to be elastic, so that it can move, for example at right angles to the wall surface of the inner wall 26. Piezo-actuators 28 are introduced into the wall material of the channel 12 and of the reservoir 25 as actuators in order to produce movements such as these. The electrical contact with the piezo-actuators 28 and with the annular electrodes 20a, 20b, which are likewise embedded in the wall material, is not illustrated, for the sake of clarity.

By way of example, the piezo-actuators can be used to produce oscillations which act on the nanoparticles 18b via the coating 27. This counteracts adhesion of the nanoparticles on the inner wall 26. The annular electrodes 20a, 20b can also be activated in order to eject nanoparticles 18b from the transport channel 12. By way of example, a continuous flow of nanoparticles 18b can be produced by application of a DC voltage to the annular electrodes 20a, 20b. However, it is also possible to meter nanoparticles 18b by applying a pulsed current or else an alternating current to the annular electrodes 20a, 20b. In these situations, the electrical capacitor field which varies over time and is produced by the annular electrodes 20a, 20b likewise contributes to this oppression of accumulation of nanoparticles on the inner wall 26. The possible methods which can be used to drive the annular electrodes 20a, 20b can, of course, also be used for the coil arrangement shown in FIG. 1.

Figure 4:
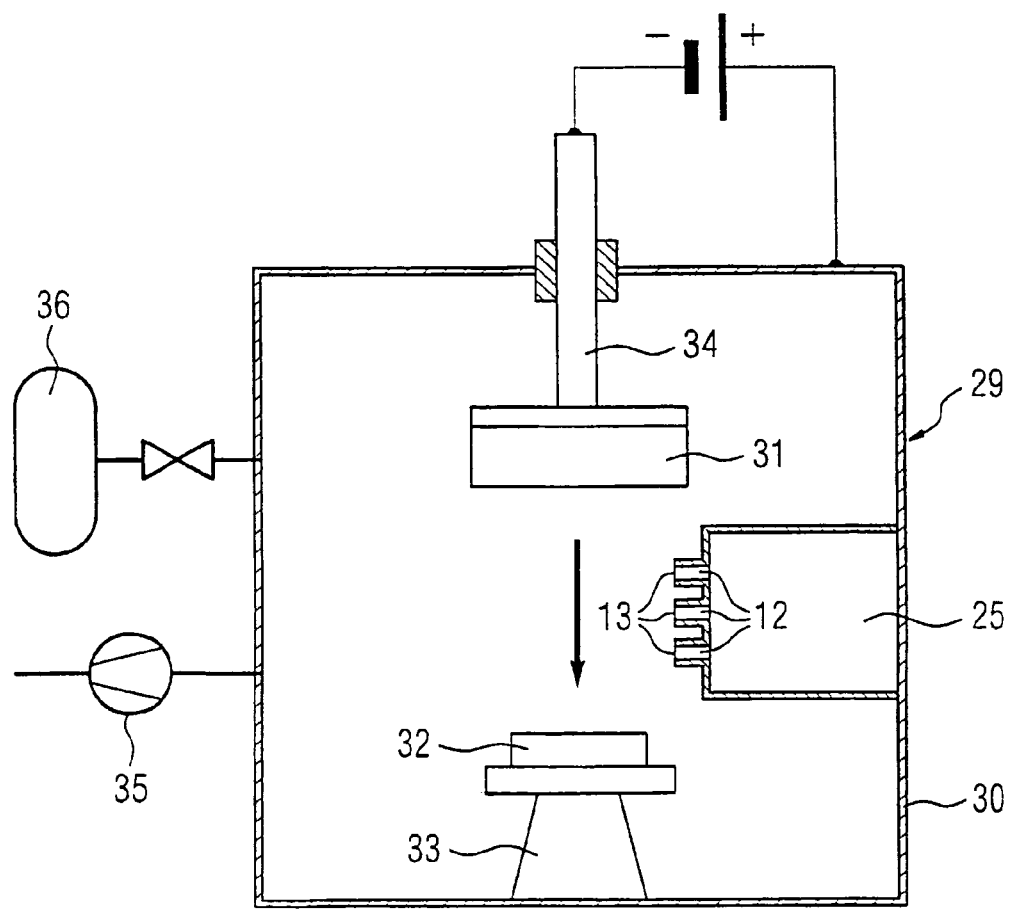

FIG. 4 illustrates a PVD coating installation 29 in which, for example, an array of transport channels 12, which are connected to a reservoir 25, and have ejection openings 13 can be used in order to introduce individual nanoparticles into the PVD coating process. The PVD coating installation essentially comprises a vacuum chamber 30, in which a target 31 is arranged opposite a substrate 32 to be coated. The substrate is located on an electrically neutral cap 33, while the target 31 is arranged on a holder 34, in the form of an anode. The wall of the vacuum chamber 30 forms the associated cathode.

The vacuum chamber can be evacuated by means of a vacuum pump 35, and a reaction gas can be introduced into the vacuum chamber from a supply container 36. The reaction gas can be used to ignite a plasma in the vacuum chamber 30, releasing particles from the target 31, for deposition on the substrate 32. The nanoparticles are introduced into this particle flow with the aid of the transport channels 12, so that they are incorporated in the coating. The nanoparticles can also be fed into the arc of an arc vapor deposition installation (not illustrated).

The invention claimed is:

1. A method for operation of a transport system for dry, electrically charged nanoparticles, having a transport channel for the nanoparticles and a field generator for an electric field, which is arranged with respect to the transport channel in such a manner that the electric field can be produced with field lines which are directed at least essentially along a profile of the transport channel, an inner wall of the transport channel is configured to move radially with respect to its profile and is equipped with an actuator, in such a manner that the actuator produces movements of the inner wall at right angles to a wall surface of the inner wall, said method comprising producing a static field in the transport channel and maintaining said static field as long as the nanoparticles are continuously conveyed.

2. The method for operation of a transport system for dry, magnetized nanoparticles, having a transport channel for the nanoparticles and a field generator for a magnetic field, which is arranged with respect to the transport channel in such a manner that the magnetic field in the transport channel can be produced inhomogeneously with lines of force which are directed essentially along a profile of the transport channel, an inner wall of the transport channel is configured to move radially with respect to its profile and is equipped with an actuator, in such a manner that the actuator produces movements of the inner wall at right angles to a wall surface of the inner wall, said method comprising producing a pulsating field in the transport channel, and metering the nanoparticles by adjustment of the pulses.

3. A transport system for dry, magnetized nanoparticles, comprising:
   a transport channel for the nanoparticles and
   a field generator for a magnetic field, which is arranged with respect to the transport channel in such a manner that the magnetic field in the transport channel can be produced inhomogeneously with lines of force which are directed essentially along the profile of the transport channel,
   an inner wall of the transport channel is configured to move radially with respect to its profile and is equipped with an actuator, in such a manner that the actuator produces movements of the inner wall at right angles to a wall surface of the inner wall.

4. The transport system as claimed in claim 3, characterized in that
   the field generator (14*a*) has an electrical coil (15), which is in the form of a winding around the transport channel (12), for the magnetic field.

5. The transport system as claimed in claim 3, characterized in that
   the transport channel (12) opens into an ejection opening (13) for the nanoparticles.

6. A transport system for dry, electrically charged nanoparticles, comprising:
   a transport channel for the nanoparticles and
   a field generator for an electrical field, which is arranged with respect to the transport channel in such a manner that the electrical field can be produced with field lines which are directed at least essentially along the profile of the transport channel,
   an inner wall of the transport channel is configured to move radially with respect to its profile and is equipped with an actuator, in such a manner that the actuator produces oscillatory movements of the inner wall at right angles to a wall surface of the inner wall.

7. The transport system as claimed in claim 6, characterized in that
   the field generator (14*b*) for the electrical field has an electrical capacitor (20*a*, 20*b*)

8. The transport system as claimed in claim 6, characterized in that
   the transport channel (12) opens into an ejection opening (13) for the nanoparticles.

9. The transport system as claimed in claim 6, wherein the actuator is a piezo-actuator.

* * * * *